(12) United States Patent
Morosawa

(10) Patent No.: US 6,479,838 B2
(45) Date of Patent: Nov. 12, 2002

(54) THIN FILM TRANSISTOR, THIN FILM TRANSISTOR ARRAY SUBSTRATE, LIQUID CRYSTAL DISPLAY DEVICE, AND ELECTROLUMINESCENT DISPLAY DEVICE

(75) Inventor: Narihiro Morosawa, Nara (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/920,049

(22) Filed: Aug. 2, 2001

(65) Prior Publication Data

US 2002/0033485 A1 Mar. 21, 2002

(30) Foreign Application Priority Data

Aug. 2, 2000 (JP) .......................................... 2000-234443

(51) Int. Cl.$^7$ .......................... H01L 29/04; H01L 31/20; H01L 31/036; H01L 31/0376; H01L 27/01
(52) U.S. Cl. ............................. 257/72; 257/59; 257/350
(58) Field of Search ............................. 257/57, 59, 61, 257/72, 350

(56) References Cited

U.S. PATENT DOCUMENTS 6,265,730 B1 * 7/2001 Nakanishi et al. ............ 257/57
6,372,608 B1 * 4/2002 Shimoda et al. ............ 438/455

FOREIGN PATENT DOCUMENTS

JP            6-61489         3/1994
JP            6-120499        4/1994

* cited by examiner

Primary Examiner—Ngân B. Ngô
(74) Attorney, Agent, or Firm—Parkhurst & Wendel, L.L.P.

(57) ABSTRACT

A thin film transistor having a source region and a drain region having a low melting point region composed of a semiconductor with a melting point lower than that of the semiconductor of the channel region is provided. In the thin film transistor, the dopant concentrations of the low melting point region of the source region adjacent to the channel region and the low melting point region of the drain region adjacent to the channel region are precisely controlled. Using the thin film transistor, a high performance thin film transistor array substrate is also provided, as well as a high display speed liquid crystal display device and a high display speed electroluminescent display device having a high aperture ratio or a high pixel resolution.

21 Claims, 8 Drawing Sheets

THIN FILM TRANSISTOR, THIN FILM TRANSISTOR ARRAY SUBSTRATE, LIQUID CRYSTAL DISPLAY DEVICE, AND ELECTROLUMINESCENT DISPLAY DEVICE

BACKGROUND OF THE INVENTION (1) Field of the Invention

The present invention relates to a thin film transistor, a method of producing the thin film transistor, a thin film transistor array substrate using the thin film transistor, and display devices using the thin film transistor array substrate such as a liquid crystal display device and an electroluminescent display device. More particularly, the invention relates to a thin film transistor having a channel region, a source region, and a drain region, the source and drain regions having a low melting point region composed of a semiconductor having a melting point lower than that of the semiconductor in the channel region, and relates to fabrication methods and applications of the thin film transistor.

(2) Description of the Prior Art

The escalating demands for increased performance in electronic appliances employing thin film transistors (hereafter, also abbreviated as TFTs) require further scaling down of the sizes, higher response speed, and lower power consumption in the TFTs. The requirements are particularly strong in TFTs for use in display devices, such as active matrix driven liquid crystal display devices. In order to meet these requirements, it is necessary that a thin film transistor having a channel region with a short channel length and a short channel width be driven at low voltage.

Conventionally, the channel region, the source region, and the drain region in a thin film transistor are formed of the same kind of semiconductor. Amorphous silicon thin film transistors (a-Si TFTs) and polycrystalline silicon thin film transistors (p-Si TFTs), in which those regions are formed of amorphous silicon thin film and polycrystalline silicon thin film, respectively, are well known in the art. In addition, polycrystalline silicon germanium thin film transistors (p-SiGe TFT) have been disclosed in Japanese Unexamined Patent Publication Nos. 6-61489 and 6-120499.

To date, a-Si TFTs and p-Si TFTs have been widely used in display devices such as liquid crystal display devices and electroluminescent display devices (hereafter abbreviated as EL display devices). In addition, there is a prior-art technique for liquid crystal display devices and EL display devices in which, using p-Si TFTs, pixel TFTs and peripheral driver circuit TFTs are both formed on a glass substrate.

Where the channel region, the source region, and the drain region are made of the same kind of semiconductor, the dopant leaks and diffuses into the channel region during the heat treatment for activating a dopant contained in the source region and the drain region in the fabrication, reducing the effective channel region and degrading the performance of the TFT. Furthermore, in the cases of p-Si TFTs and p-SiGe TFTs, the dopant likewise leaks and diffuses into the channel region when a crystallization step is performed after the doping of the dopant.

In the case of a p-Si TFT, due to the fact that, in polycrystalline silicon, the dopant diffuses fast along the grain boundaries, the dopant contained in the source region and the drain region leaks and diffuses even more widely into the channel region. Further, in the case of a TFT in which a polycrystalline silicon thin film is used for the channel region, the OFF current is larger than that of a TFT in which an amorphous silicon thin film is used for the channel region. In order to control the OFF current, there are prior art techniques which involve the forming of a lightly doped drain (LDD) region, in which the dopant concentration is low, or the forming of a source region having a low dopant concentration and a drain region having a low dopant concentration.

In a TFT having an LDD region and a channel region composed of a polycrystalline silicon thin film, the LDD region, which is in contact with the channel region, has a low dopant concentration, and therefore, the amount of dopant that diffuses into the channel region is small. However, the resistance rate of a polycrystalline silicon thin film having a low dopant concentration is easily affected by the dopant concentration, and therefore, even if the amount of diffused dopant is small, the resistance value greatly varies, causing the additional problem of it being difficult to form an LDD region exhibiting a uniform concentration. In other words, in the TFT, a uniform parasitic resistance is difficult to obtain, and a large variation in the driving current is caused. This discussion is also applicable to a source region having a low dopant concentration.

In the case of p-SiGe TFTs, according to Japanese Unexamined Patent Publication Nos. 6-61489 and 6-120499, the temperature of the heat treatment during the fabrication can be reduced, and thereby the leaking and diffusing of the dopant into the channel region is reduced. However, as with the case where the channel region is formed of a polycrystalline silicon thin film, the OFF current increases. Moreover, in the case where polycrystalline silicon germanium is used for the channel region, the density of the crystal defect increases when compared to that in the case where polycrystalline silicon is used for the channel region, degrading the subthreshold characteristics.

Furthermore, where reduction of the sizes of a-Si TFTs, p-Si TFTs, and p-SiGe TFTs is necessary, the dopant diffusion more acutely affects the degradation of TFT characteristics since the width of the diffusion of the dopant into the channel region is invariable. Therefore, the proportion of the diffusion resistances of the source and drain regions to the parasitic resistance of the TFT increases, degrading the driving performance of the TFT. In addition, where it is necessary to ensure a certain channel length in the channel region in which the dopant is not diffused, the source region and the drain region must be made smaller. However, if the contact areas between the source region and the source electrode and between the drain region and the drain electrode are made smaller, the proportion of the contact resistance to the parasitic resistance increases.

In summary, the prior art TFT has the following problems. 1) When the channel region, the source region, and the drain region are formed of the same kind of semiconductor, the dopant concentration in a boundary portion of the source region adjacent to the channel region and that in a boundary portion of the drain region adjacent to the channel region are difficult to precisely control. 2) In particular, in application fields requiring high-speed driving characteristics such as in display devices, the channel region needs to be formed of a polycrystalline semiconductor, but the use of polycrystalline semiconductor for the channel region necessitates reduction in off-current by providing an LDD region. Therefore, if the dopant concentration cannot be precisely controlled, it is difficult to uniformly form TFTs having unvarying characteristics. 3) When a polycrystalline silicon germanium thin film is used for the channel region, it is possible to reduce the temperature of the heat treatment required in the fabrication process, but the subthreshold characteristics of the TFT tend to degrade.

SUMMARY OF THE INVENTION

In view of the foregoing and other problems of the prior art, it is an object of the invention to provide a TFT having a channel region composed of a first semiconductor, a source region comprising a first low melting point region composed of a second semiconductor having a melting point lower than that of the first semiconductor, and a drain region comprising a second low melting point region composed of a third semiconductor having a melting point lower than that of the first semiconductor, whereby the dopant concentrations of a first dopant contained in the boundary portion of the source region adjacent to the channel region and of a second dopant contained in the boundary portion of the drain region adjacent to the channel region are precisely controlled. It is a second object of the invention to provide a method of producing the TFT of the invention. It is a third object of the invention to provide a TFT array substrate comprising the TFTs made in accordance with the invention. It is a fourth object of the invention to provide a liquid crystal display device comprising the TFTs made in accordance with the invention. It is a fifth object of the invention to provide an EL display device comprising the TFTs made in accordance with the invention.

In order to accomplish the first object of the invention, there is provided a TFT formed on an insulating substrate, comprising: a channel region comprising a high melting point region composed of a first semiconductor; a source region being in contact with the high melting point region of the channel region, the source region comprising a first low melting point region composed of a second semiconductor having a melting point lower than that of the first semiconductor, and the source region containing a first dopant; a source electrode electrically connected to the high melting point region of the channel region via the first low melting point region of the source region; a drain region being spaced apart from the source region and in contact with the high melting point region of the channel region, the drain region comprising a second low melting point region composed of a third semiconductor having a melting point lower than that of the first semiconductor, and the drain region containing a second dopant; a drain electrode electrically connected to the high melting point region of the channel region via the low melting point region of the drain region; and a gate electrode electrically insulated from the channel region, the source electrode, and the drain electrode, the gate electrode controlling an electric field applied to the channel region.

This makes it possible to provide such a TFT that the boundary portion of the source region between the channel region and the source region and the boundary portion of the drain region between the channel region and the drain region have precisely controlled dopant concentrations.

In addition, it is made possible to enlarge, in comparison with the prior art, the effective channel region in which the dopant is not leaked or diffused, and accordingly, even with the scaling down of the size of a TFT is necessary, high performance of the TFT is ensured. The TFT in accordance with the present invention may be any of a planar TFT, a top gate staggered TFT, and a bottom gate staggered TFT. The term "insulating substrate" is intended to include a substrate having electrically insulative property and such a substrate that an electrically insulating film is formed on an arbitrary substrate. Note also that the term "the high melting point region" in the channel region is intended to mean a region composed of the first semiconductor having a melting point higher than those of the second semiconductor of the source region and the third semiconductor of the drain region.

The channel region may have the high melting point region in a portion thereof, but it is preferable that the channel region consist of only the high melting point region. The source region may consist of only the first low melting point region or may have the first low melting point region in a portion thereof. Specifically, the inside of the source region may have a layer of the second semiconductor. Likewise, the drain region may consist of only the second low melting point region or may have the second low melting point region in a portion thereof.

The second semiconductor and the third semiconductor may be any semiconductors as long as the melting points thereof are lower than that of the first semiconductor. Accordingly, the second semiconductor and the third semiconductor may be of the same semiconductor or may be of different semiconductors. When the second semiconductor and the third semiconductor are of the same semiconductor, the fabrication process is simplified, improving fabrication efficiency and reducing fabrication costs. Thus, it is possible to provide the TFT according to the invention at low cost.

Dopants are classified into two types, namely, acceptor dopants and donor dopants. When the first dopant and the second dopant are both acceptor dopants, an n-channel TFT is produced, whereas when both are donor dopants, a p-channel TFT is produced. As long as the first dopant and the second dopant are of the same type, they need not be the same dopant, but when the same dopant is used for both, the fabrication process is simplified, thereby improving fabrication efficiency and reducing fabrication costs. Thus, it is made possible to produce a TFT according to the invention at low cost.

When the first semiconductor of the channel region is a polycrystalline semiconductor, a TFT having excellent driving performance is provided. The driving performance of a TFT is primarily determined by the property of the first semiconductor which constitutes the channel region. Therefore, as long as the channel region is formed of a polycrystalline semiconductor, the source region may or may not be formed of a polycrystalline semiconductor. The drain region also may or may not be formed of a polycrystalline semiconductor as long as the channel region is formed of a polycrystalline semiconductor.

The discussion is now directed to melting points of the first semiconductor, the second semiconductor, and the third semiconductor. The melting point of a semiconductor varies depending on the semiconductor material that makes up the semiconductor and on the crystal structure. When the same semiconductor material is used, the melting point varies depending on the crystal structure, whereas when a plurality of the same semiconductors are used, the melting point varies depending on the composition ratio, the crystal structures thereof, and the like.

First, when a TFT is constructed such that the semiconductor of the source region and the third semiconductor of the drain region are composed of the same semiconductor material as that of the first semiconductor of the channel region but the crystal structure of the semiconductor material is different from that of the first semiconductor, precise control of the dopant concentration is reliably achieved. A specific example thereof is such a TFT that the first semiconductor is a polycrystalline semiconductor, and the second semiconductor and the third semiconductor are an amorphous semiconductor composed of the same semiconductor material as that of the first semiconductor.

Second, when a TFT is constructed such that each of the second semiconductor of the source region and the third semiconductor of the drain region comprises group IVB atoms and the same semiconductor material as that of the first semiconductor of the channel region, precise control of the dopant concentration is also reliably achieved. Preferable examples of the group IVB atoms are carbon (C), silicon (Si), and germanium (Ge). Specific examples of the TFT construction include the following: the first semiconductor is made of silicon and the second semiconductor and the third semiconductor are made of silicon and germanium; the first semiconductor is made of silicon and the second semiconductor and the third semiconductor are made of silicon, germanium, and carbon; and the first semiconductor is made of germanium and the second semiconductor and the third semiconductor are made of germanium and silicon. As long as the first semiconductor is a polycrystalline semiconductor, each of the second semiconductor and the third semiconductor may or may not be a polycrystalline semiconductor.

Each of the second semiconductor and the third semiconductor is not limited to a semiconductor in which the same semiconductor as that of the first semiconductor and the group IVB atoms are uniformly distributed, but the group IVB atoms may be unevenly distributed therein. For example, in the case where the same semiconductor material as that of the first semiconductor is uniformly distributed, the group IVB atoms may be distributed so that the concentration of the group IVB atoms is high in the vicinity of the surface and the concentration decreases toward the lower portion, or that the concentration of the group IVB atoms is high in a specific region and in the rest of the region, the concentration is low. A specific example of such a TFT may include such a TFT that each of the low melting point regions of the source and drain regions has, in a local region thereof, a germanium high concentration region in which the atomic density of germanium is higher than the rest of the source or drain region, and the germanium high concentration region of the source region is in contact with the channel region and the source electrode and the germanium high concentration region of the drain region is in contact with the channel region and the drain electrode.

Third, when a TFT is constructed such that the second semiconductor of the source region and the third semiconductor of the drain region consist of only a different semiconductor material from that of the first semiconductor and the third semiconductor, precise control of the dopant concentration is also reliably achieved. A specific example thereof includes such a TFT that the semiconductor material constituting the first semiconductor is silicon and the semiconductor material constituting the second semiconductor and the third semiconductor is germanium. When the first semiconductor is a polycrystalline semiconductor, the second semiconductor and the third semiconductor may or may not be a polycrystalline semiconductor.

The following construction is also possible: the second low melting point region of the drain region has a low concentration-doped drain region and a high concentration-doped drain region, the high concentration doped drain region having a dopant concentration higher than that of the low concentration-doped drain region and being connected to the channel region via the low concentration-doped drain region, and the drain electrode is in contact with the high concentration-doped drain region. This makes it possible to suppress degradation of OFF current characteristics of the TFT (increase in the OFF current of the TFT), even when the channel region is composed of a polycrystalline semiconductor. In addition, it is possible to provide, in a like manner, a low concentration-doped source region and a high concentration-doped source region in the first low melting point region of the source region.

In order to accomplish the second object of the invention, there is provided a method of producing a TFT comprising: forming a semiconductor thin film on an insulating substrate, the semiconductor thin film composed of a first semiconductor; patterning the semiconductor thin film by photolithography and etching to form a patterned semiconductor thin film; forming a first electrically insulating film so as to cover the patterned semiconductor thin film; subsequent to the step of forming a first electrically insulating film, forming a gate electrode on the patterned semiconductor thin film; implanting ions having group IVB atoms into a portion of the patterned semiconductor thin film to form a pair of low melting point regions on the patterned semiconductor thin film, the low melting point regions being spaced apart from each other and composed of a second semiconductor; doping the regions where the pair of the low melting point regions have been formed with a dopant to form a source region, a drain region, and a channel region, such that the source and drain regions are doped with the dopant and that the channel region is not doped with the dopant and is sandwiched between the source region and the drain region; forming a second electrically insulating film so as to cover the gate electrode; forming a source electrode and a drain electrode, the source electrode piercing through the first and second insulating films on the source region and being electrically insulated from the gate electrode, the drain electrode piercing through the first and second insulating films on the drain region and being electrically insulated from the gate electrode and electrically connected to the drain electrode; and heating the source region and the drain region at a predetermined temperature to activate the dopant contained in the source region and the drain region.

In comparison with the case where the channel region, the source region, and the drain region are formed of the same semiconductor, the heat treatment temperature can be reduced when activating the dopant contained in the source region and the drain region. Therefore, by the above-described method, the diffusion of the dopant into the channel region is suppressed, and it is made possible to provide a planar TFT in which the dopant concentrations are precisely controlled in the boundary portion between the channel region and the source region and in the boundary portion between the channel region and the drain region.

When the step of implanting group IVB atoms is carried out subsequent to the step of forming a gate electrode, the gate electrode may be used as a mask, simplifying the forming to a pair of regions having differing melting points in the patterned semiconductor thin film. Alternatively, the step of implanting group IVB atoms may be carried out prior to the step of forming a gate electrode by using a resist mask having a predetermined pattern. Further, the step of implanting group IVB atoms may be such that one kind of group IVB atoms is implanted or that a plurality of kinds of group IVB atoms are implanted. In this step, it is preferable that the ions having group IVB atoms be ions of a hydride of group IVB atoms. The group IVB atoms may be of carbon, silicon, or germanium. More specifically, monosilane ($SiH_4$), germanium hydride ($GeH_4$), methane ($CH_4$), or the like may be employed for the source molecules. In addition, it is possible that the step of implanting group IVB atoms is repeated a plurality of times to implant a first group IVB atoms into one of the low melting point regions and a second group IVB atoms into the other low melting point region.

In another embodiment, in order to accomplish the second object of the invention, there is provided a method of producing a TFT, comprising: forming a first thin film composed of a third semiconductor on an insulating substrate; patterning the first thin film by photolithography and etching to form a source thin film and a drain thin film; doping the first thin film or the source and drain thin films with a dopant to form a source region in the source thin film and a drain region in the drain thin film, such that the source and drain regions are doped with the dopant; subsequent to the step of patterning a first thin film, forming a second thin film over the insulating substrate, the second thin film composed of a fourth semiconductor having a melting point higher than that of the third semiconductor; patterning the second thin film by photolithography and etching to form a channel thin film connecting the source thin film and the drain thin film; forming a first electrically insulating film so as to cover the source thin film, the drain thin film, and the channel thin film; subsequent to the step of forming a first electrically insulating film, forming a gate electrode above the channel thin film; forming a second electrically insulating film so as to cover the gate electrode; forming a source electrode and a drain electrode, the source electrode piercing through the first and second electrically insulating films so as to reach the source region and being electrically insulated from the gate electrode, the drain electrode piercing through the first and second electrically insulating films on the drain region so as to reach the drain region and being electrically insulated from the gate electrode; and heating the source region and the drain region at a predetermined temperature to activate the dopant contained in the source region and the drain region.

In comparison with the case where the channel region, the source region, and the drain region are formed of the same semiconductor, the heat treatment temperature can be reduced when activating the dopant contained in the source region and the drain region. Therefore, by the above-described method, the diffusion of the dopant into the channel region is suppressed, and it is made possible to provide a top gate TFT in which the dopant concentrations are precisely controlled in the boundary portion between the channel region and the source region and in the boundary portion between the channel region and the drain region.

In place of the step of forming the source and drain electrodes in the above method, it is possible to include a step of forming a source electrode and a drain electrode on the insulating substrate prior to the step of forming a first thin film and to form the source thin film above the source electrode and the drain thin film above the drain thin film in the step of patterning the first thin film. This achieves a top gate staggered TFT. In addition, in place of the step of forming a first thin film and the step of patterning the first thin film, it is possible to form the source thin film and the drain thin film by the steps of forming a third thin film composed of a fourth semiconductor on the insulating substrate, patterning the third thin film by photolithography and etching to form thin films spaced from each other, and implanting ions having group IVB atoms into the pair of thin films. This achieves a top gate staggered TFT.

In further another embodiment, in order to accomplish the second object of the invention, there is provided a method of producing a TFT comprising: forming a gate electrode on an insulating substrate; forming a first electrically insulating film so as to cover the gate electrode; subsequent to the step of forming a first electrically insulating film, forming a first thin film composed of a fifth semiconductor on the insulating substrate; patterning the first thin film by photolithography and etching to form a channel thin film above the gate electrode; forming a second thin film composed of a sixth semiconductor having a melting point lower than that of the fifth semiconductor; patterning the second thin film by photolithography and etching to form a source thin film and a drain thin film, the source and drain regions being in contact with the channel thin film and spaced apart from each other; doping the source thin film and the drain thin film with a dopant to form a source region and a drain region; forming a source and drain electrodes, the source electrode being electrically connected to the source region, the drain electrode being spaced from the source electrode and in contact with the drain region; and heating the source region and the drain region at a predetermined temperature to activate the dopant in the source region and the drain region.

Compared to the case where the channel region, the source region, and the drain region are composed of the same semiconductor, the treatment temperature can be reduced in activating the dopant contained in the source region and the drain region. Therefore, by the above-described method, the diffusion of the dopant into the channel region can be suppressed, and it is made possible to provide a bottom gate staggered TFT in which the dopant concentrations in the boundary portions between the channel region and the source region and between the channel region and the drain region are precisely controlled. In addition, because the treatment temperature can be reduced, the resistances of the source region and the drain region are sufficiently lowered even when the heating step, which is conventionally carried out using a heat treatment furnace, is performed using a rapid heating apparatus such as a lamp annealer. Moreover, by using the rapid heating apparatus, the throughput of fabrication can be remarkably improved.

In place of the steps of forming a second thin film and patterning the second thin film, it is possible to form the source thin film and the drain thin film by the steps of forming a third thin film composed of the fifth semiconductor, patterning the third thin film by photolithography and etching to form a pair of thin films spaced apart from each other and connected to each other via the channel thin film, and implanting ions having group IVB atoms into the pair of thin films to form a low melting point region composed of a sixth semiconductor having a melting point lower than that of the fifth semiconductor. This achieves a bottom gate staggered TFT.

The following are commonly applicable to the fabrication methods of a planar TFT, a top gate staggered TFT, and a bottom gate staggered TFT.

When a step of crystallizing the semiconductor which forms the channel region is included in the methods described above, a TFT having high driving performance is produced. As long as the channel region is subjected to the step of crystallizing, the semiconductors of the source region and the drain region may be polycrystallized. It is noted that when the semiconductor of the channel region is polycrystallized, the OFF current characteristics of the TFT are lowered.

However, it is possible to include, subsequent to the step of doping, the step of additionally doping a portion of the drain region with a dopant to form a low concentration-doped drain region and a high concentration-doped drain region, the low concentration-doped drain region having not been subjected to the additional doping and in contact with the channel region, the high concentration-doped drain region having been subjected to the additional doping having a dopant concentration higher than the low concentration-doped drain region. This suppresses degradation of the OFF current characteristics of the TFT, even when the channel region of the TFT is formed of a polycrystalline semiconductor.

In the step of heating, the heat treatment temperature for activating the dopant may be 600° C. or lower so that the deformation of the substrate in the heat treatment is suppressed even when a glass substrate is used as the insulating substrate. This widens the choice of the substrate.

In order to accomplish the third object of the invention, there is provided a TFT array substrate comprising an insulating substrate; a plurality of thin film transistors according to the present invention, the thin film transistors formed on the insulating substrate, a source line electrically connected to the source electrode, a drain line electrically connected to the drain electrode, and a gate line electrically connected to the gate electrode.

By employing the above-described construction, it is made possible to provide a TFT array substrate in which high performance TFTs are arranged with good flatness. In addition, since the TFTs according to the invention are employed and the heat treatment temperature is thereby reduced, it is made possible to provide a TFT array substrate having a TFT array formed on a glass substrate with good flatness. This allows a wider choice of the substrate.

When the TFTs employed in the array substrate are such that the the channel region consists of only the high melting point region, the high melting point region being composed of polycrystalline silicon, the source region consists of only the first low melting point region, the first low melting point region being composed of polycrystalline silicon germanium, and the drain region consists of only the second low melting point region, the second low melting point region being composed of polycrystalline silicon germanium, the array substrate has improved performance over those employing conventional p-Si TFTs and p-SiGe TFTs.

In order to accomplish the fourth objection of the invention, there is provided a liquid crystal display device comprising an insulating substrate, a TFT according to the invention formed on the insulating substrate, a source line electrically connected to the source electrode, a drain line electrically connected to the drain electrode, a gate line electrically connected to the gate electrode, a display electrode formed on a surface of the insulating substrate and electrically connected to the drain line, a first liquid crystal alignment film covering the thin film transistors the source line, the drain line, the gate line, and the display electrode, an opposing substrate opposing the insulating substrate, an opposing electrode formed on the opposing substrate and opposing the display electrode, a second liquid crystal alignment film formed on the opposing substrate and covering the opposing electrode, a liquid crystal layer being in contact with the first liquid crystal alignment film and the second liquid crystal alignment film and sandwiched between the insulating substrate and the opposing substrate; and a sealing portion for sealing the liquid crystal layer, the sealing portion provided at a peripheral region of the insulating substrate and the opposing substrate.

In the device construction as described above, an insulating substrate on which small-sized, high performance TFTs are arranged with high precision is employed, and therefore, a high display speed liquid crystal display device having a high aperture ratio or a high pixel resolution is achieved. The TFT according to the invention may be employed for the pixel TFTs and/or the peripheral driver circuit TFTs.

When the TFT employed in the liquid crystal device is such that the channel region consists of only the high melting point region composed of polycrystalline silicon, the source region consists of only the first low melting point region composed of polycrystalline silicon germanium, and the drain region consists of only the second low melting point region composed of polycrystalline silicon germanium, the liquid crystal display device has improved performance over those employing conventional p-Si TFTs and p-SiGe TFTs.

In order to accomplish the fifth object of the invention, there is provided an EL display device comprising an insulating substrate, a TFT according to the invention formed on the insulating substrate, a source line electrically connected to the source electrode, a drain line electrically connected to the drain electrode, a gate line electrically connected to the gate electrode, a display electrode formed on a surface of the insulating substrate, an opposing electrode opposing the display electrode, and a light-emitting layer formed between the display electrode and the opposing electrode.

In the device construction as described above, an insulating substrate on which small-sized, high performance TFTs are arranged with high precision is employed, and therefore, a high display speed EL display device having a high aperture ratio or a high pixel resolution is achieved. The TFT according to the invention may be employed for the pixel TFTs and/or the peripheral driver circuit TFTs.

When the TFT employed in the EL display device is such that the channel region consists of only the high melting point region composed of polycrystalline silicon, the source region consists of only the first low melting point region composed of polycrystalline silicon germanium, and the drain region consists of only the second low melting point region composed of polycrystalline silicon germanium, the EL display device has improved performance over those employing conventional p-Si TFTs and p-SiGe TFTs.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
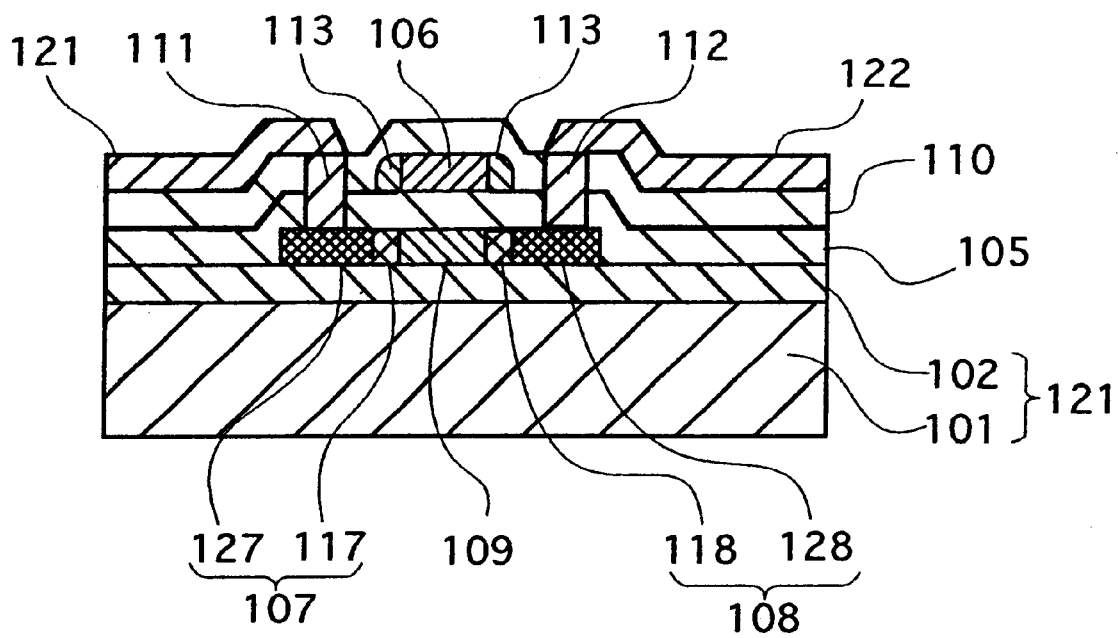
FIG. 1 is a cross-sectional view showing an example of a planer TFT.

Referring now to the drawings, preferred embodiments of the invention are detailed below.

Embodiment I-1

Figure 2A:
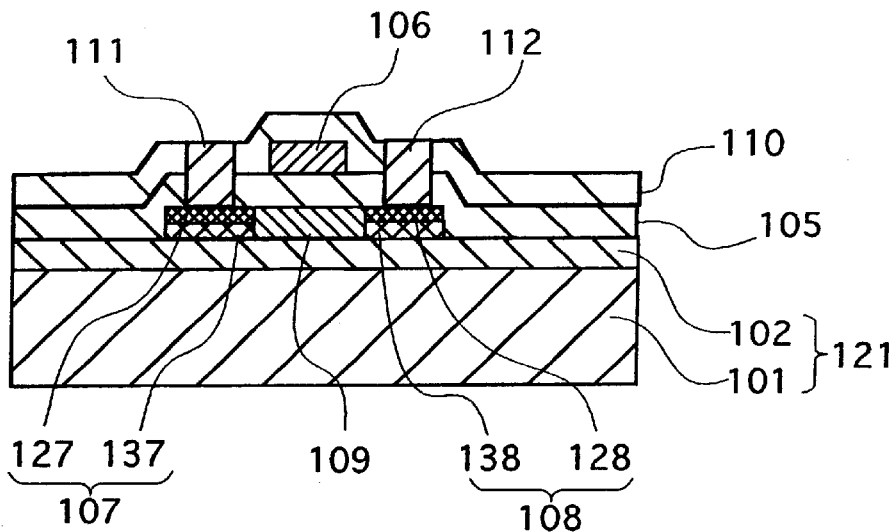
FIG. 2A is a cross-sectional view showing an example of the structure of a planar TFT.

Referring to FIGS. 1, 2A, and 3, the present Embodiment I-1 discusses fabricating methods and constructions of a planar TFT. FIG. 1 shows an example of a planar TFT in which a low concentration-doped region is formed in each of the source region and the drain region. FIG. 2A shows an example of a planar TFT in which each of the source and drain regions has a semiconductor layer having a melting point lower than that of the semiconductor of the channel region. FIGS. 3A–3I show an example of a fabricating method for a planar TFT provided with a LDD region.

With reference to FIG. 3, discussed below is an example of the method of fabricating a planar TFT in which the channel region consists of only a high melting point region comprising a polycrystalline semiconductor, each of the source region and the drain region consists of only a low melting point region comprising a polycrystalline semiconductor having a melting point lower than that of the channel region, and the source region and the drain region have, respectively, a low concentration doped source region and a low concentration doped source region.

First, an insulative protective film 102 is formed on a substrate 101 to prepare an insulating substrate 121. On the insulating substrate 121, a semiconductor thin film comprising a first semiconductor is formed (the step of forming a semiconductor thin film). The semiconductor thin film is subjected to dehydrogenation treatment, and the dehydrogenated semiconductor thin film is heat-treated to form a polycrystallized semiconductor 103 (the step of crystallizing, FIG. 3A).

Figure 3A:
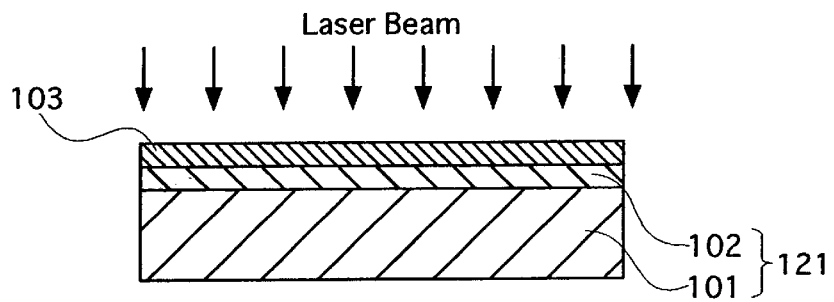
FIG. 3A is a cross-sectional view for illustrating an example of the producing method for planar TFTs, which shows a crystallization process.
Figure 3B:
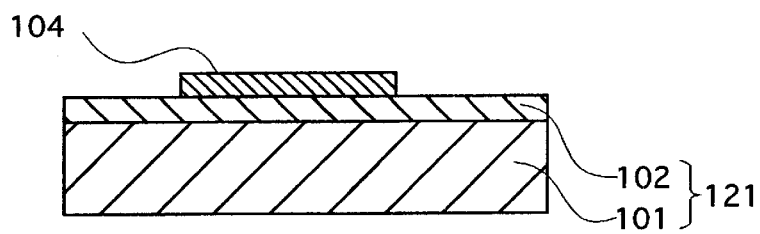
FIG. 3B is a cross-sectional view for illustrating an example of the producing method for planar TFTs, which shows a stage of the production immediately after an islands formation process.
Figure 3C:
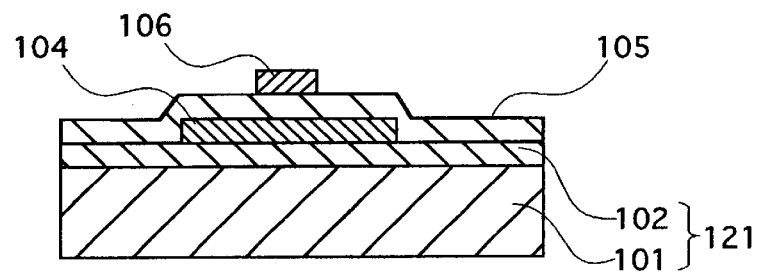
FIG. 3C is a cross-sectional view for illustrating an example of the producing method for planar TFTs, which shows a stage of the production immediately after an electrode formation process.

The polycrystallized semiconductor thin film 103 is patterned by photolithography and etching to form a patterned semiconductor thin film 104 having channel regions, source regions, and drain regions (the step of patterning, FIG. 3B).

It is noted here that the step of patterning does not necessarily follow the step of crystallizing, but the step of crystallizing may be performed subsequent to the step of forming a semiconductor thin film and the step of patterning. It is also noted that the dehydrogenation is not essential but preferable because the dehydrogenation is important in improving crystallinity. The heat treatment in the step of crystallizing may be performed by putting the substrate 101 in contact with a heat source or by irradiating the substrate 101 with light, such as a laser beam. In particular, in the case where it is necessary to polycrystallize only a portion of the patterned semiconductor thin film 104, it is preferable that a laser beam be employed.

Next, a first electrically insulating film 105 (a gate insulating film) made of silicon oxide film, silicon nitride film, or the like is formed so that the insulating film covers the patterned semiconductor thin film 104 (the step of forming a first electrically insulating film). Thereafter, a gate electrode is formed on the patterned semiconductor thin film 104 so that the first electrically insulating film 105 is sandwiched therebetween (the step of forming a gate electrode, FIG. 3C). Suitable electrodes for the gate electrode include a metal electrode formed of MoW or the like and a semiconductor electrode formed of polycrystalline silicon germanium or the like.

Figure 3D:
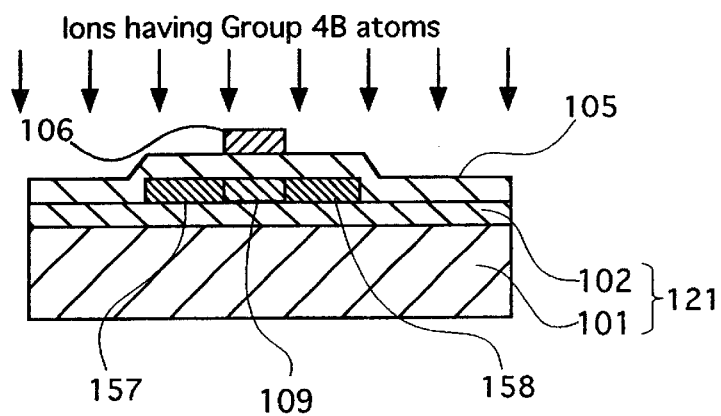
FIG. 3D is a cross-sectional view for illustrating an example of the producing method for planar TFTs, which shows a low melting point portion-forming process.
Figure 3E:
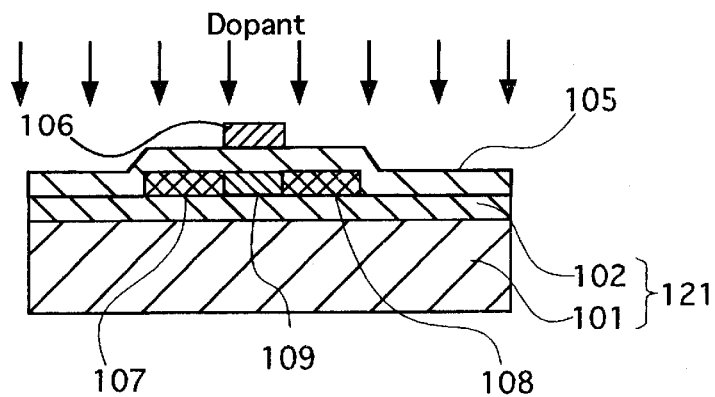
FIG. 3E is a cross-sectional view for illustrating an example of the producing method for planar TFTs, which shows a doping process.
Figure 3F:
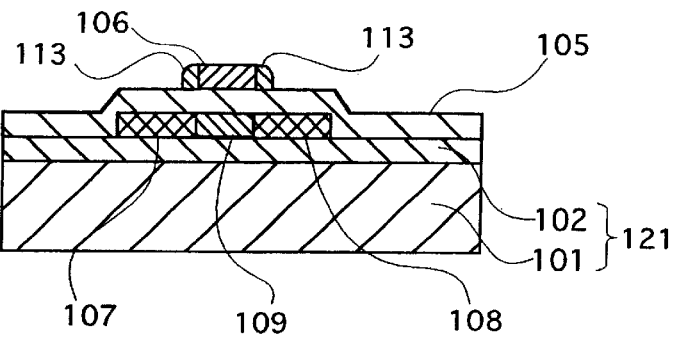
FIG. 3F is a cross-sectional view for illustrating an example of the producing method for planar TFTs, which shows a stage of the production immediately after a side wall formation process.

Next, ions having atoms of a group IVB element are implanted into the semiconductor thin film 104 to form a pair of low melting point regions 157 and 158 (the step of implanting ions having group IVB atoms, FIG. 3D). Then, the patterned semiconductor thin film 104 is doped with a dopant at a low concentration, thereby forming a source region 107 and a drain region 108 to which the dopant is added, and forming a channel region 109 to which the dopant is not added (the step of doping, FIG. 3E).

In this step, the gate electrode 106 serves as a mask, and therefore, the channel region 109 composed of a first semiconductor is formed in a portion of the patterned semiconductor thin film 104 which is under the gate electrode 106, while the source region 107 and the drain region 108, which contain the group IV atoms and the dopant, are formed in the rest of the patterned semiconductor thin film 104, in a self-aligned manner. The sequence of the step of implanting ions having group IV atoms and the step of doping may be reversed.

As discussed above, the use of the gate electrode 106 as a mask makes the fabrication step simple and is therefore preferable. However, the low melting point region may be formed by, first, forming a prescribed resist mask by photolithography and, then, adding group IV atoms and a dopant into a portion of the semiconductor, the portion being in the opening of the resist mask. In the step of doping, the source region and the drain region are doped with the same dopant. However, it is possible to add different kinds of dopants to the source region and the drain region in the following manner. Using a first resist mask formed by photolithography, a portion of the semiconductor thin film which is in an opening of the first resist mask is doped with a first dopant, and subsequently the first resist mask is removed. Thereafter, using a second resist mask formed by photolithography, a portion of the semiconductor thin film which is in an opening of the second resist mask, is doped with a second dopant and subsequently the second resist is removed.

In the step of implanting group IVB atoms, it is preferable that the atomic density of group IVB atoms be controlled to the range of 1% to 80%. Preferable examples of the group IVB atoms include carbon (C), silicon (Si), and germanium (Ge). The group IVB atoms to be implanted may consist of one type or may include a plurality of types. However, when the group IVB atoms consisting of only one type are implanted into the first semiconductor made of a semiconductor material consisting of only one type of group IVB atoms, it is necessary that the IVB atoms to be implanted be different from the semiconductor material of the first semiconductor.

Figure 3G:
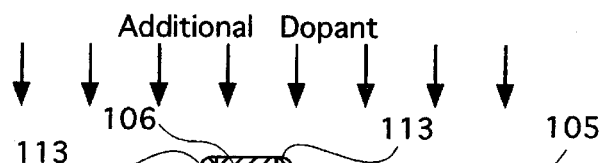
FIG. 3G is a cross-sectional view for illustrating an example of the producing method for planar TFTs, which shows an additional doping process.

Next, a side wall 113 made of such as a silicon oxide film and a silicon nitride film is formed on the sides of the gate electrode 106 in a self-aligned manner by an anisotropic etching technique (the step of forming a side wall, FIG. 3G). Thereafter, using the side wall 113 and the gate electrode 106 as masks, an additional doping is carried out for the patterned semiconductor thin film 104 (the step of additional doping). Thereby, a low concentration-doped drain region 118 is formed in the drain region 108 underneath the side wall 113, and a high concentration-doped drain region 128 is formed in the rest of the portion of the drain region 108 which is not underneath the side wall 113 or the gate electrode 106, in a self-aligned manner. Note here that in a TFT having an LDD region, the high concentration-doped drain region is usually referred to as simply "drain region." At the same time the low concentration-doped drain region 118 and the high concentration-doped drain region 128 are formed, a low concentration-doped source region 117 is formed in the source region 107 underneath the side wall 113, and a high concentration-doped source region 127 is formed in the rest of the portion of the source region 107 which is not underneath the side wall 113 or the gate electrode 106, in a self-aligned manner (FIG. 3G).

It is stated that the side wall 113 is formed by anisotropic etching, but when using a resist mask formed by a photolithography technique, additional doping may be performed for a prescribed region. The dopants used in the step of doping and in the step of additional doping need not be the same kind. In order to sufficiently reduce the OFF current, it is preferable that the concentration of the dopant implanted to the low concentration-doped drain region 118 be 1/10 or less that of the high concentration-doped drain region 108.

Figure 3H:
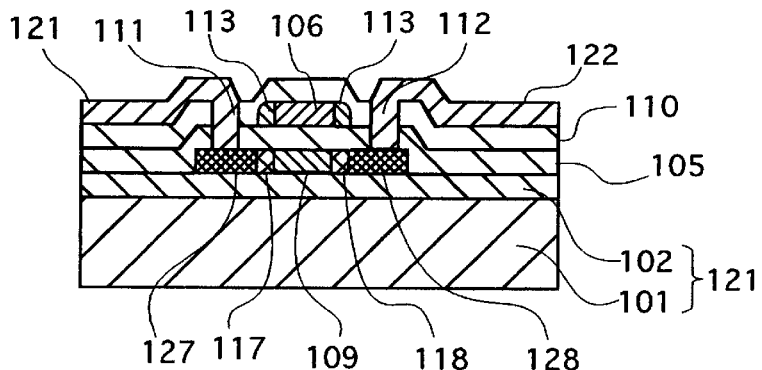
FIG. 3H is a cross-sectional view for illustrating an example of the producing method for planar TFTs, which shows a stage of the production immediately after a source-drain electrodes formation process.

Next, a second electrically insulating film 110 is formed so as to cover the gate electrode. Thereafter, a contact hole for the source electrode (a first contact hole) and a contact hole for the drain electrode (a second contact hole) are formed by photolithography and etching. The first contact hole pierces through the first electrically insulating film 105 and the second electrically insulating film 110 and reaches the source region 107. The second contact hole reaches the drain region. Subsequently, a source electrode 111 is formed so as to fill the contact hole for the source electrode, and a drain electrode 112 is formed so as to fill the contact hole for the drain electrode. (The step of forming a second electrically insulating film, FIG. 3H) FIG. 3H shows a source line 121 and a drain line 122, which are formed at the same time as the forming of the source electrode 111 and the drain electrode 112.

Next, at least the source region 107 and the drain region 108 of the semiconductor thin film are subjected to a heat treatment to form a second semiconductor and a third semiconductor and to activate the dopant contained in the source region and the drain region. In the heat treatment, the entire semiconductor thin film 104 may be heated, or only the source region 107 and the drain region 108 may be heated with laser light or the like.

Figure 3I:
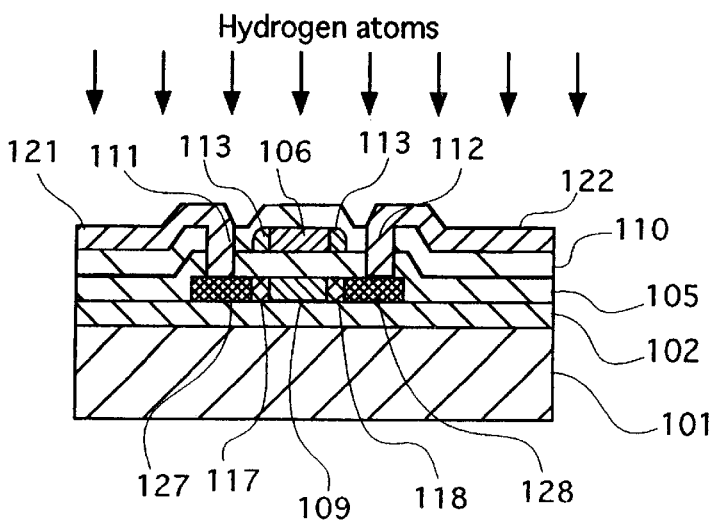
FIG. 3I is a cross-sectional view for illustrating an example of the producing method for planar TFTs, which shows a terminating process.

Finally, dangling bonds contained in the polycrystallized semiconductor thin film are terminated with hydrogen atoms (FIG. 3I). By the processes as discussed above, a planar type TFT shown in FIG. 1 is formed.

As shown in FIG. 1, the channel region 109 is formed of a first semiconductor thin film, the source region 107 a second semiconductor thin film having a melting point lower than that of the first semiconductor, and the drain region 108 a third semiconductor thin film having a melting point lower than that of the first semiconductor. This makes it possible to provide a TFT in which the dopant concentrations in the boundary portions between the channel region 109 and the source region 107 and between the channel region 109 and the drain region 108 are precisely controlled. It is preferable that the second semiconductor thin film, which forms the source region, and the third semiconductor thin film, which forms the drain region, be made of the same semiconductor thin film. Hereafter, in the cases where the second semiconductor and third semiconductor are the same, these are collectively referred to as "low melting point semiconductor". The term "low melting point semiconductor" is intended to mean a semiconductor having a melting point lower than that of the first semiconductor, which constitutes the channel region. It is preferable that the first dopant contained in the source region and the second dopant contained in the drain region be the same dopant. The use of the same semiconductor and the same dopant makes it possible to form the source region and the drain region at the same time, which achieves the provision of a low cost planar TFT.

The source region and the drain region may consist of only a low melting point semiconductor with uniform quality or may comprise the low melting point semiconductor in portions thereof. When the first semiconductor is polycrystalline silicon, preferred examples of low melting point semiconductor are polycrystalline silicon germanium, polycrystalline silicon germanium carbon, or the like.

Although the present Embodiment I-1 has discussed a planar TFT having a low concentration-doped source region and a low concentration-doped drain region, the invention is also applicable to a planar TFT not having those, as shown in FIG. 2A. As shown in FIG. 2A, the planar TFT may be such that only surface layers of the source region 107 and the drain region 108 are formed of low melting point semiconductors 137 and 138.

In the present Embodiment I-1, a TFT in which the channel region, the source region, and the drain region are formed of polycrystalline semiconductor has been discussed. The TFT may be, however, such a planar TFT that the channel region is formed of polycrystalline silicon and the source region and the drain region are formed of amorphous silicon, or that the channel region is formed of amorphous silicon and the source region and the drain region are formed of amorphous silicon germanium.

EXAMPLE 1

Example 1 discusses in more detail the planar TFT described in the foregoing Embodiment I-1.

First, on a glass substrate 101, a silicon oxide film serving as an undercoat film 302 (insulative protective film) is formed so as to have a film thickness of about 400 nm by a plasma CVD (chemical vapor deposition) method. Subsequently, an amorphous silicon thin film is formed so as to have a thickness of about 50 nm by a plasma CVD method. The formed amorphous silicon thin film is heated at about 450° C. under a nitrogen atmosphere, whereby the thin film undergoes a dehydrogenation treatment, and thereafter is irradiated with an excimer laser beam to crystallize the amorphous silicon, thus forming a polycrystalline silicon thin film 103 (FIG. 3A). Thereafter, by photolithography and etching, the polycrystalline silicon thin film is patterned so as to have a desired pattern, thus forming a patterned polycrystalline silicon thin film 104 shown in FIG. 3A.

Then, by a plasma CVD method using TEOS (tetraethylorthosilicate) gas as a source gas, a silicon oxide film having a thickness of about 100 nm is formed to serve as a gate insulating film 105 (a first electrically insulating film). Thereafter, by a sputtering method, a MoW alloy film is deposited so as to have a film thickness of about 400 to 500 nm, and the film is patterned by photolithography and etching, thus forming a gate electrode 106 shown in FIG. 3B.

In this step of forming a gate electrode, MoW alloy is employed for the gate electrode, but it is possible to employ a semiconductor electrode composed of polycrystalline silicon germanium therefor. In this case, subsequent to the forming of the amorphous silicon thin film, a step of forming a low melting point portion and a step of annealing are carried out to form the gate electrode composed of polycrystalline silicon germanium. When polycrystalline silicon germanium is employed for the gate electrode, a threshold voltage of the TFT is reduced.

Next, ions containing germanium are implanted in the area other than the channel region at a dose of about $1 \times 10^{16}$ $cm^{-2}$ to dope the area with germanium atoms. When the dose of germanium atoms is less than $1 \times 10^{14}$ $cm^{-2}$, the melting point of the source and drain regions does not decrease, whereas when the dose is more than $1 \times 10^{17}$ $cm^{-2}$, the OFF current of the TFT undesirably increases. Therefore, it is desirable that the dose of germanium be from $1 \times 10^{14}$ $cm^{-2}$ to $1 \times 10^{17}$ $cm^{-2}$.

Next, a resist mask is formed by photolithography, and thereafter, using the resist mask, the patterned semiconductor thin film 104 is doped with boron (B) at a low concentration of about $5 \times 10^{12}$ $cm^{-2}$ by an ion doping method, thereby forming p– regions (a source region 107 and a drain region 108).

Next, a silicon oxide film is formed by a plasma CVD method at a thickness of about 500 nm. Thereafter, under the condition in which a sufficient etching selective ratio of the silicon oxide film and polycrystalline silicon is ensured, the silicon oxide film is anisotropically etched by dry etching, thus forming a side wall 113 made of the silicon oxide film on the side of the gate electrode in a self-aligned manner.

Although the side wall 113 is formed of a silicon oxide film in the present Example 1, the side wall 113 may be formed of a layered film of a silicon oxide film and a silicon nitride film. When the side wall 113 is made of a layered film of a silicon oxide film and a silicon nitride film, unevenness of the width of the side wall is reduced.

Next, a resist mask is formed by photolithography. Subsequently, by an ion doping method, the p– region is doped with boron at a high concentration, at a dose of about $1 \times 10^{14}$ $cm^{-2}$, thereby forming p+ regions (a high concentration-doped source region 127 and a high concentration-doped drain region 128). Thereby, a high concentration-doped source region 127 and a high concentration-doped drain region 128, in which boron is added as a dopant, are formed in a self-aligned manner.

In Example 1, ions containing germanium atoms are implanted and subsequently a low concentration dopant is implanted to form the LDD region. However, the low concentration dopant may be implanted prior to the implantation of the ions containing germanium atoms. In the present example, a p-type source region and a p-type drain region are formed. When a p-channel type TFT is desired, phosphorus (P) may be used as the dopants used in the step of doping and in the step of additional doping, at the same concentrations as those in the case of boron as discussed above.

Next, a silicon oxide film, serving as an interlayer insulating film 110 (a second electrically insulating film), is formed by a plasma CVD method to have a film thickness of about 500 nm. Subsequently, a contact hole for source electrode (a first contact hole) and a contact hole for drain electrode (a second contact hole) are formed by photolithography and etching. Thereafter, a Ti/Al film is formed to have a film thickness of 80/4000 nm, and then, a source electrode 111 and a drain electrode 112 are formed, followed by the formation of a source line 121 and a drain line 122 having desired patterns.

Next, a silicon nitride film having a film thickness of about 500 nm is formed as a protective film by a plasma CVD method. Thereafter, annealing for a hydrogenation treatment is performed at about 350° C. for about one hour in a hydrogen atmosphere or a nitrogen atmosphere to introduce hydrogen into the polycrystalline silicon thin film 103 as well as an interface between the polycrystalline silicon thin film 103 and the gate insulating film 105. For the hydrogenation treatment, a plasma CVD method may be applied after the forming of the silicon oxide film serving as the interlayer insulating film 110 to utilize hydrogen radicals produced by plasma discharging of hydrogen gas. When the hydrogenation treatment utilizing hydrogen radicals is employed, hydrogen is sufficiently introduced with high efficiency.

Figure 7:
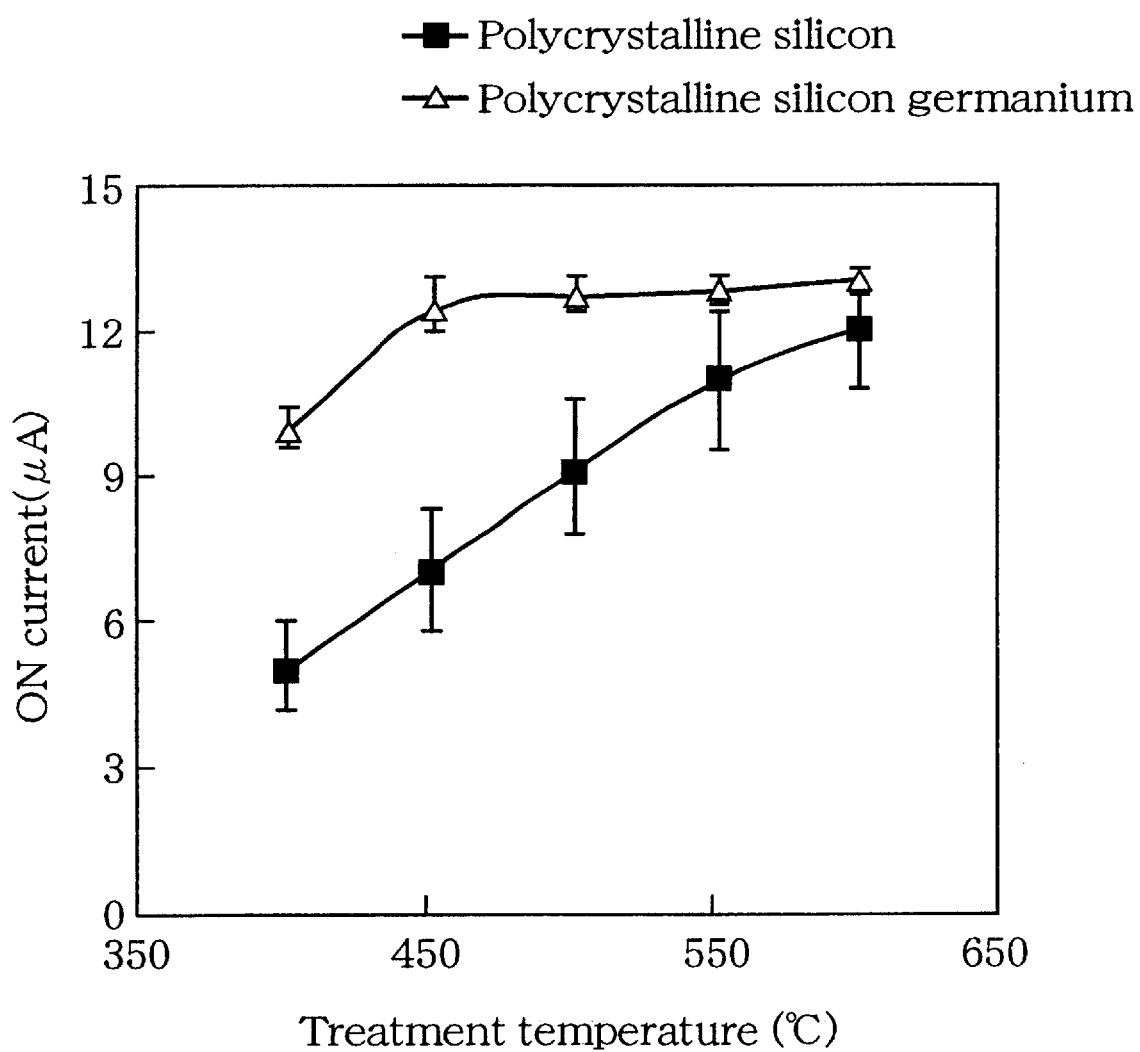
FIG. 7 shows the dependency of the ON currents of an NMOS TFT on treatment temperatures in the step of heating for activating a dopant.

FIG. 7 shows the ON current dependency of NMOS type TFTs with respect to process temperatures in the heating step. The treatment hour was 1 hour in all of the measurements. In cases where the source region and the drain region are formed of polycrystalline silicon, the field effect mobility and the threshold voltage of the TFT do not saturate unless the temperature of the heat treatment is 600° C. or higher. In cases where germanium atoms are implanted, however, the field effect mobility and the threshold voltage of the TFT saturate at a treatment temperature of 500° C. Accordingly, from FIG. 7, it is understood that when the source region and the drain region are formed of silicon germanium, it is possible to reduce the treatment temperature of the heating step.

Table 1 shows the sheet resistances of the source region or the drain region of TFTs of Example 1. Table 1 also shows the contact resistances between the source regions and the source electrodes or between the drain regions and the drain electrodes in the TFTs of Example 1. Both of the polycrystalline silicon thin film and the polycrystalline silicon germanium thin film used in the measurements of sheet resistance and contact resistance had a thickness of 500 Å.

TABLE 1

| | Polycrystalline silicon | | Polycrystalline silicon germanium | |
|---|---|---|---|---|
| | Sheet Resistance | Contact Resistance | Sheet Resistance | Contact Resistance |
| N-channel | 800 Ω/□ | 50 Ω | 300 Ω/□ | 10 Ω |
| P-channel | 1500 Ω/□ | 100 Ω | 500 Ω/□ | 20 Ω |

(Specific resistance [Ω · cm] = Sheet resistance [Ω/□] · film thickness [Å] × $10^{-8}$)

As seen from Table 1, when the source region and the drain region are formed of polycrystalline silicon germanium, the sheet resistances and the contact resistances are smaller than those formed of polycrystalline silicon, regardless of whether the TFT is an n-channel type or a p-channel type. Thus, when both the source region and the drain region in a TFT are formed of polycrystalline silicon germanium, the sheet resistances of the source region and the drain region and the contact resistances between the source region and the source electrode and between the drain region and the drain electrode decrease, and thereby the driving current increases.

In the case where the source region and the drain region are formed of polycrystalline silicon, unevenness of the threshold voltages in NMOS type TFT is large when the temperature of the heat treatment is 600° C. However, when the source region and the drain region are formed of polycrystalline silicon germanium, the unevenness of the threshold voltages is remarkably reduced even when the heat treatment temperature is 500° C. Accordingly, when the source region and the drain region are formed of silicon germanium and the heat treatment temperature is thereby reduced, it is possible to suppress the unevenness of threshold voltages of channel TFTs that accompanies size reduction of TFTs. Thus, it is made possible to form reduced sized TFTs when compared with conventional TFTs.

In conventional p-Si TFTs, the substrate potential fluctuates during the operation of the transistors because holes are accumulated below the channel region, causing instability in the driving characteristics of the TFTs. By contrast, when the source region and the drain region are formed of polycrystalline silicon germanium, holes easily flow into the drain region because polycrystalline silicon germanium has a band offset in the valence band. For this reason, the accumulation of holes below the channel region is suppressed, and thereby the fluctuation of the channel region potential caused by the accumulation of holes is reduced, improving operation stability of the TFT.

EXAMPLE 2

Using a plasma CVD method, an undercoat film 102 (an insulating protective film) composed of a silicon oxide film is formed on a glass substrate so as to have a film thickness of about 500 nm. Subsequently, using a mixture gas of $SiH_4$ and $GeH_4$ as a source gas, an amorphous silicon germanium thin film is deposited by a plasma CVD method so as to have a film thickness of about 50 nm, and thereafter, by photolithography and dry etching, a source thin film and a drain thin film are formed so as to have an island structure. The source thin film later forms a source region 107, the drain thin film a drain region 108. Subsequently, an amorphous silicon thin film, which later forms a channel region 109, is deposited by a plasma CVD method.

Thereafter, the steps subsequent to the step of crystallization described in Example 1 above are carried out to form TFTs each in which the source region and the drain region are formed of a layered film of a polycrystalline silicon germanium thin film and a polycrystalline silicon thin film and the channel region is composed of polycrystalline silicon.

In the TFT of the present Example 2, the source region and the drain region are formed of a layered film of a polycrystalline silicon germanium thin film and a polycrystalline silicon thin film, and therefore, even when the heat treatment subsequent to the impurity ion doping is performed at as low as about 450° C., damage to the crystal lattice is sufficiently repaired. For this reason, it is possible to reduce the temperature of the heat treatment, which has conventionally been about 600° C. As a result, the dopant diffusion from the source region and the drain region to the channel region is suppressed, and contraction of the glass during the heat treatment is also prevented.

Embodiment I-2

Figure 2B:
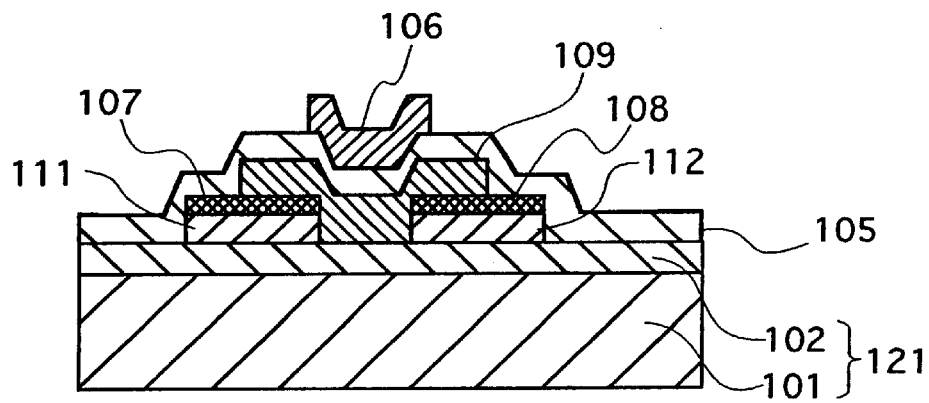
FIG. 2B is a cross-sectional view showing an example of the structure of a top gate staggered type TFT.

Embodiment I-2 discusses a top gate staggered TFT with reference to FIG. 2B.

First, a first metal film is formed on an insulating substrate 121 having a substrate 101 and an insulative protective film 102, and subsequently, a source electrode 111 and a drain electrode 112 are formed by photolithography and etching. A first thin film comprising a third semiconductor is then formed, and thereafter the first thin film is patterned by photolithography and etching to form a source thin film on the source electrode 111 and a drain film on the drain electrode 112. Subsequently, the source thin film and the drain thin film are doped with a dopant to form a source region 107 on the source thin film and a drain region 108 on the drain thin film. Subsequently, a second thin film composed of a fourth semiconductor having a melting point higher than that of the third semiconductor is formed and then patterned by photolithography and etching to form a channel region 109 (a channel thin film) connecting the source region 107 and the drain region 108. Subsequently, the channel region 109, the source region 107, and the drain region 108 are subjected to dehydrogenation, and thereafter the insulating substrate 121 is brought into contact with a heat source to crystallize each region. Subsequently, a first electrically insulating film 105 is formed so as to cover the source region 107, the drain region 108, and the channel region 109. Subsequently, a second metal film is formed, and by photolithography and etching, a gate electrode 106 is formed on the first electrically insulating film 105 over the channel thin film. Subsequently, a protective film is formed so as to cover the gate electrode, and thereafter, the insulating substrate 121 is heated by contacting the substrate with a heat source to activate the dopant contained in the source region 107 and the drain region 108. Finally, the channel thin film 109, the source thin film 107, and the drain thin film 108 are subjected to a hydrogenation treatment to terminate the dangling bonds contained therein.

By the above processes, a top gate staggered TFT as shown in FIG. 2B is formed. The present Embodiment I-2 has discussed a technique in which the channel region, the source region, and the drain region are formed of polycrystalline semiconductor. It is possible, however, that in the step of crystallizing, only the channel region is polycrystallized by a laser light. When this is the case, the source thin film or the drain thin film may also be polycrystallized. When the step of crystallizing is performed, it is preferable that the semiconductor thin film to be polycrystallized be subjected to a dehydrogenation treatment prior to the step of crystallizing, and that the dehydrogenated semiconductor thin film be subjected to a hydrogenation treatment subsequent to the step of crystallizing. It is also possible that the step of crystallizing is not performed and all of the channel region, the source region, and the drain region are formed of amorphous semiconductor.

When doping the source thin film and the drain thin film with a dopant, it is possible that the lower portions of the thin films be doped with a dopant at a high concentration and the upper portions thereof be doped with a dopant at a low concentration. Thereby, a TFT having an LDD region is formed. To form a TFT having an LDD region, the following is also be possible; a thin film for forming a low concentration-doped drain region is formed between the drain electrode and the drain thin film and/or a thin film for forming a low concentration-doped source region between the source electrode and the source thin film, and these thin films thus formed are doped with a dopant at a concentration lower than the dopant concentrations of the source thin film and the drain thin film.

Embodiment I-3

Figure 2C:
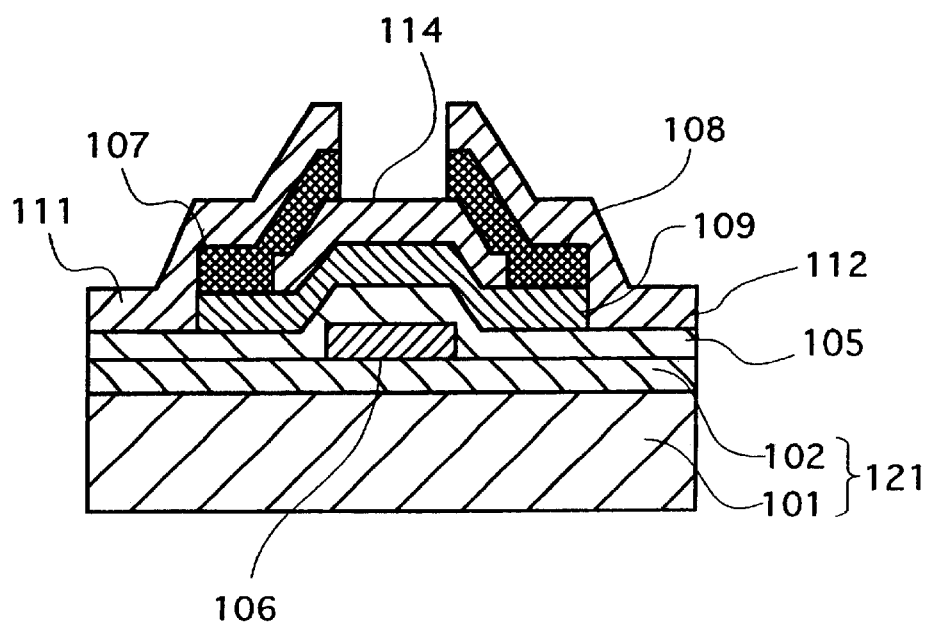
FIG. 2C is a cross-sectional view showing an example of the structure of a bottom gate staggered type TFT.

Embodiment I-3 discusses a bottom gate staggered TFT with reference to FIG. 2C.

First, a first metal film is formed on an insulating substrate 121 having a substrate 101 and an insulative protective film 102, and thereafter, a gate electrode 106 is formed by photolithography and etching. Subsequently, a first electrically insulating film 105 is formed so as to cover the gate electrode. Subsequently, over the insulating substrate 121, a first thin film composed of a fifth semiconductor is formed and then patterned by photolithography and etching to form a channel region 109 (a channel thin film) is formed above the gate electrode 106. Subsequently, over the insulating substrate 121, a second thin film composed of a sixth semiconductor which has a melting point lower than that of the fifth semiconductor is formed and then patterned by photolithography and etching to form a pair of a source thin film and a drain thin film which are in contact with the channel region 109 and spaced apart from each other. Subsequently, the channel thin film, the source thin film, and the drain thin film are subjected to dehydrogenation and thereafter, the insulating substrate 121 is brought into contact with a heat source to crystallize these thin films. Subsequently, the source thin film and the drain thin film are doped with a dopant to form a source region 107 in the source thin film and a drain region 108 in the drain thin film. Subsequently, a second metal film is formed, and by photolithography and etching, a source electrode 111, which is in contact with the source region 107, and a drain electrode 112, which is spaced from the source electrode 111 and in contact with the drain region 108, are formed. Subsequently, the source region 107 and the drain region 108 are heated to activate the first dopant in the source region 107 and the second dopant in the drain region 108. Finally, the channel region 109, the source region 107, and the drain region 108 are subjected to a hydrogenation treatment to terminate the dangling bonds contained therein.

By the above-described procedure, a bottom gate staggered TFT shown in FIG. 2C is formed. The present Embodiment I-3 has illustrated a technique in which the channel region, the source region, and the drain region are made of polycrystalline semiconductor, but the invention is not limited thereto. In the step of crystallizing, only the channel thin film may be polycrystallized using a laser light. When this is the case, the source thin film or the drain thin film may also be polycrystallized. In addition, when the step of crystallizing is performed after the first semiconductor thin film is formed or after the channel thin film is formed, it is possible that only the channel region is formed of polycrystalline semiconductor. When the step of crystallizing is performed, it is preferable that the semiconductor thin film to be polycrystallized be subjected to a dehydrogenation treatment prior to the step of crystallizing and the dehydrogenated semiconductor thin film be subjected to a hydrogenation treatment subsequent to the step of crystallizing. It is also possible that the step of crystallizing is not performed and all of the channel region, the source region, and the drain region are formed of amorphous semiconductor.

When doping the source thin film and the drain thin film with a dopant, it is possible that the lower portions of the thin films be doped with a dopant at a high concentration and the upper portions thereof be doped with a dopant at a low concentration. Thereby, a TFT having an LDD region is formed. To form a TFT having an LDD region, the following is also be possible; a thin film for forming a low concentration-doped drain region is formed between the drain electrode and the drain thin film and/or a thin film for forming a low concentration-doped source region between the source electrode and the source thin film, and these thin films thus formed are doped with a dopant at a concentration lower than the dopant concentrations of the source thin film and the drain thin film.

Embodiment II

Embodiment II discusses a TFT array substrate employing the TFT in accordance with the invention. Using the TFT described in the foregoing Example 1 in constructing a TFT array formed on an insulating substrate, a TFT array substrate having a high performance TFT array is fabricated utilizing conventional techniques.

Figure 4:
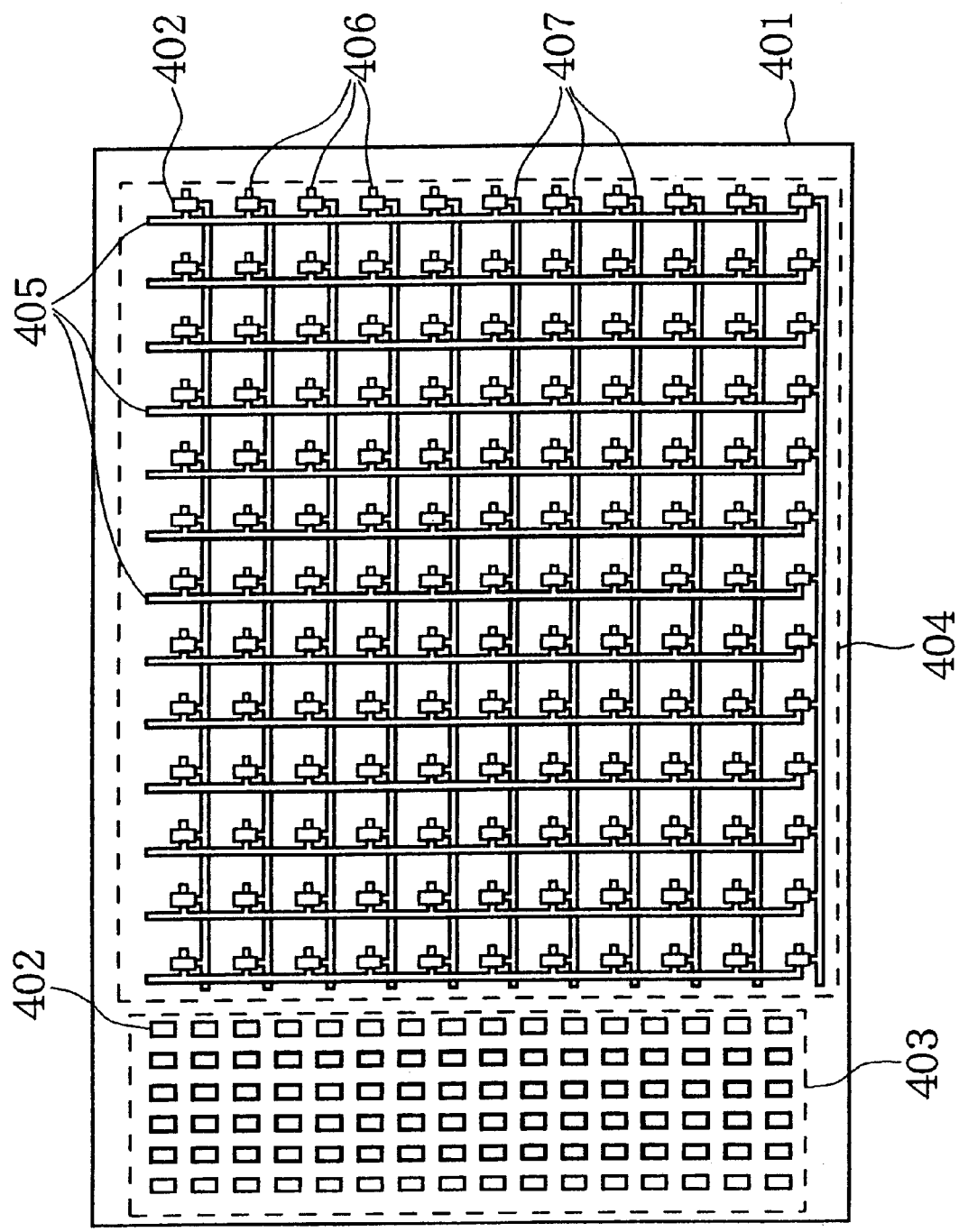
FIG. 4 is a plan view showing an example of a TFT array substrate.

The TFT made in accordance with the invention may be used for either all the TFTs or part of the TFTs in the TFT array. The TFT array may be such that a TFT array having a first pattern is formed on an insulating substrate, or may be such that a TFT array having a plurality of different patterns is formed on an insulating substrate. FIG. 4 illustrates a TFT array substrate including, on an insulating substrate 401, a first TFT array 403 having TFTs 402 arranged in a first pattern, a second TFT array 404 having TFTs 402 arranged in a second pattern, a source line 405, a drain line 406, and a gate line 407.

In addition, in the case where the TFT of the present invention is used for all the TFTs formed on the insulating substrate, various constructions of the invention may be combined together to form a TFT array.

In the fabrication of the TFT array substrate in which the TFT made in accordance with the invention is used for part of the TFTs on the insulating substrate, as is easily understood by the fabrication procedure of the TFT described in the foregoing Embodiments I-1 to I-3, it is possible that a resist mask is formed in prescribed regions on the insulating substrate so that group IVB atoms are not implanted in the prescribed regions. This makes it possible that the TFTs of the invention and conventional p-Si TFTs or the like are simultaneously formed in the same fabrication process. Additionally, in the step of implanting group IVB atoms, prescribed regions on the insulating substrate may be implanted with the group IVB atoms. This makes it possible to simultaneously form the TFTs of the invention and conventional p-SiGe TFTs in the same fabrication process.

Embodiment III

Embodiment III discusses a liquid crystal display device employing the TFT made in accordance with the invention.

Utilizing conventional techniques, a high-performance liquid crystal display device is produced by using the TFT described in the foregoing Example 1 for the pixel TFTs and/or the peripheral driver circuit TFTs in the liquid crystal display device.

Figure 5:
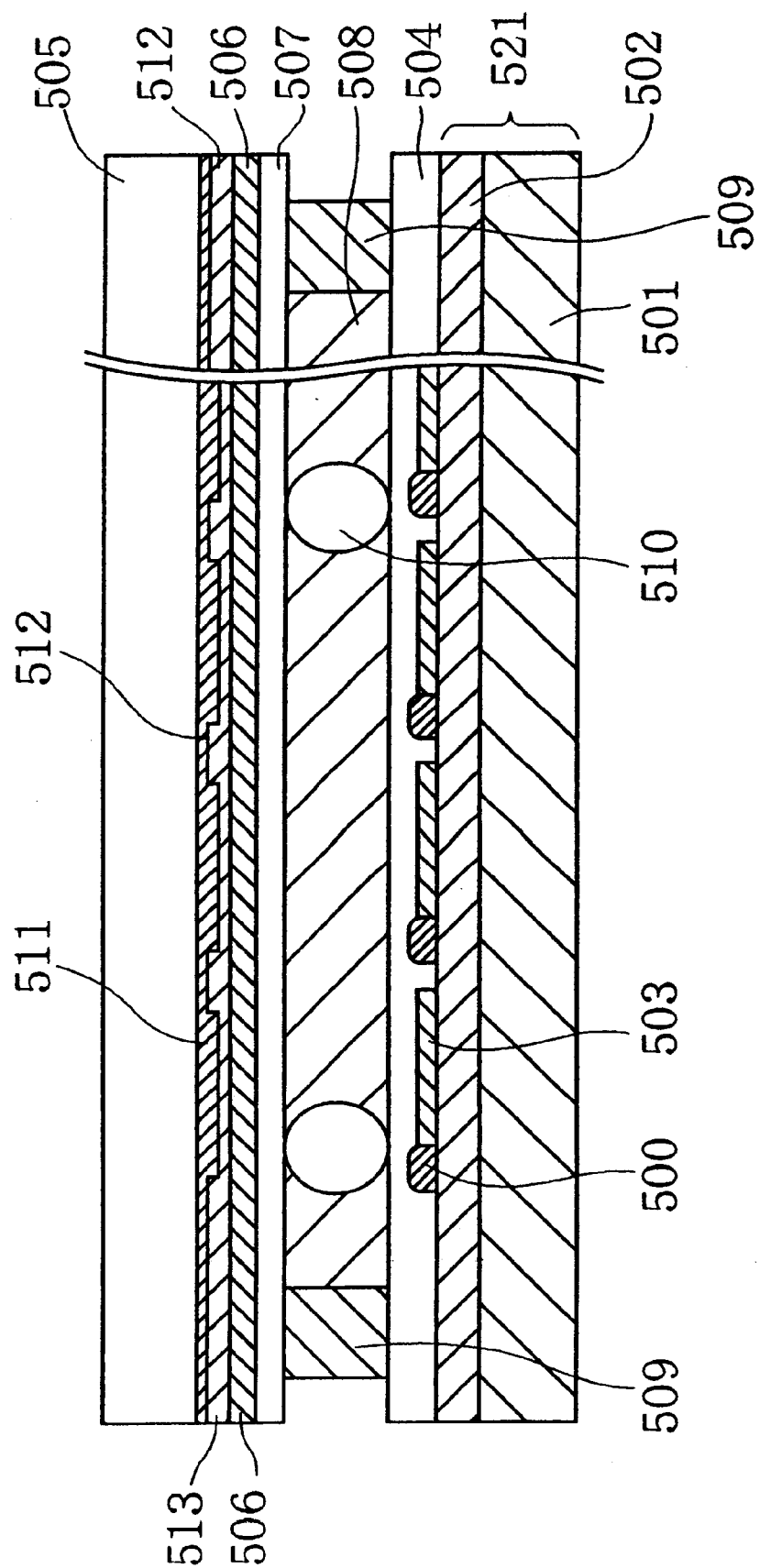
FIG. 5 is a cross-sectional view showing an example of a liquid crystal display device.

FIG. 5 shows an example of a liquid crystal display device in which TFTs made accordance with the invention are used as pixel TFTs. The liquid crystal display device includes the following: an insulating substrate 521 in which an insulative protective film 502 is formed on a substrate 501; TFTs 500 according to the invention which are formed on the insulating substrate 521; a source line electrically connected to the source electrode; a drain line electrically connected to the drain electrode; a gate line electrically connected to the gate electrode; a display electrode 503 formed on the surface of the insulating substrate 521; a first liquid crystal alignment film 504 covering the TFT 500, the source line, the drain line, the gate line, and the display electrode 503; an opposing substrate 505 opposing the insulating substrate 521; an opposing electrode 506 formed on the opposing substrate 505 and opposing the display electrode 503; a second liquid crystal alignment film 507 formed on the opposing substrate 505 and covering the opposing electrode 506; a liquid crystal layer 508 being in contact with the first liquid crystal alignment film and the second liquid crystal alignment film and sandwiched between the insulating substrate 521 and the opposing substrate 505; a sealing portion 509 for sealing the liquid crystal layer, the sealing portion provided at a peripheral portion of the insulating substrate 521 and the opposing substrate 505; spacers 510 dispersed in the liquid crystal layer; a color filter 511 and a black matrix 512 provided between the opposing substrate 505 and the second liquid crystal alignment film 507; and a color filter-protecting film 513 covering the surfaces of the color filter 511 and the black matrix 512. Note that the wiring lines are not shown in FIG. 5 for the sake of clarity and brevity in the drawing.

Embodiment IV

Embodiment IV discusses an EL display device employing the TFTs as described in the foregoing Example 1. A high-performance EL display device is produced utilizing conventional techniques by using the TFT described in the foregoing Example 1 for the pixel TFTs and/or the peripheral driver circuit TFTs in the EL display device.

Figure 6A:
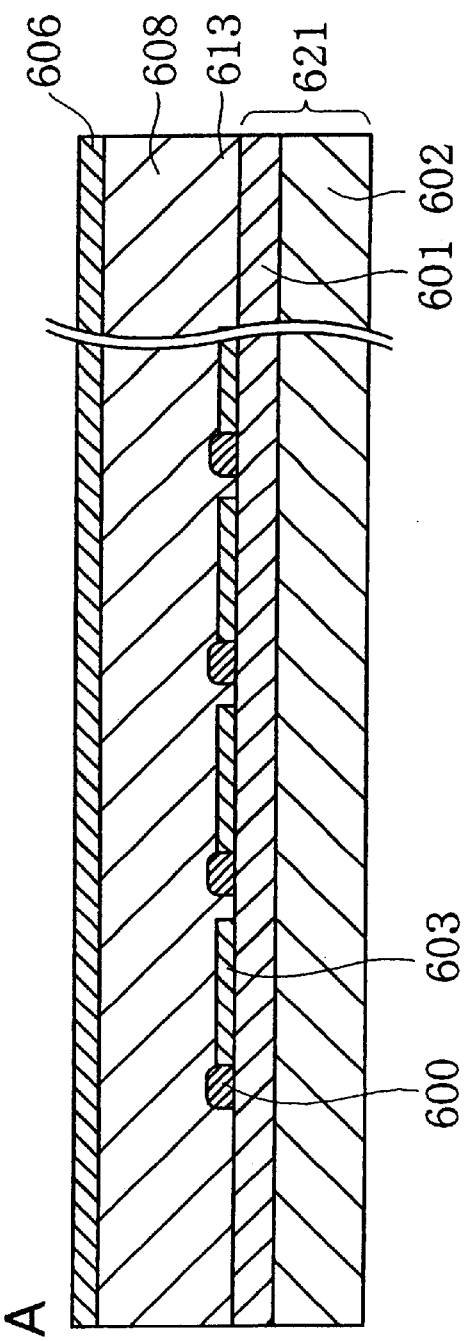
FIGS. 6A and 6B are cross-sectional views showing examples of the structure of an EL display device, FIG. 6A illustrating an example of a display device having a light emitting layer and FIG. 6B a display device having a light-emitting layer formed of an organic material.

FIG. 6A shows an example of the EL display device employing the TFTs made in accordance with the invention as the pixel TFTs. The EL display device includes the following: an insulating substrate 621 in which a substrate 601 is coated with an insulative protective film 502; a TFT 600 according to the invention, which are formed on the insulating substrate 601; a source line electrically connected to the source electrode of the TFT 600; a drain line electrically connected to the drain electrode of the TFT 600; a gate line electrically connected to the gate electrode of the TFT 600; a pixel electrode (a display electrode) 603 formed on a surface of the insulating substrate 621; a transparent common electrode (an opposing electrode) 606 opposing the pixel electrode 603; and a light emitting layer provided between the pixel electrode 603 and the transparent common electrode 606.

Figure 6B:
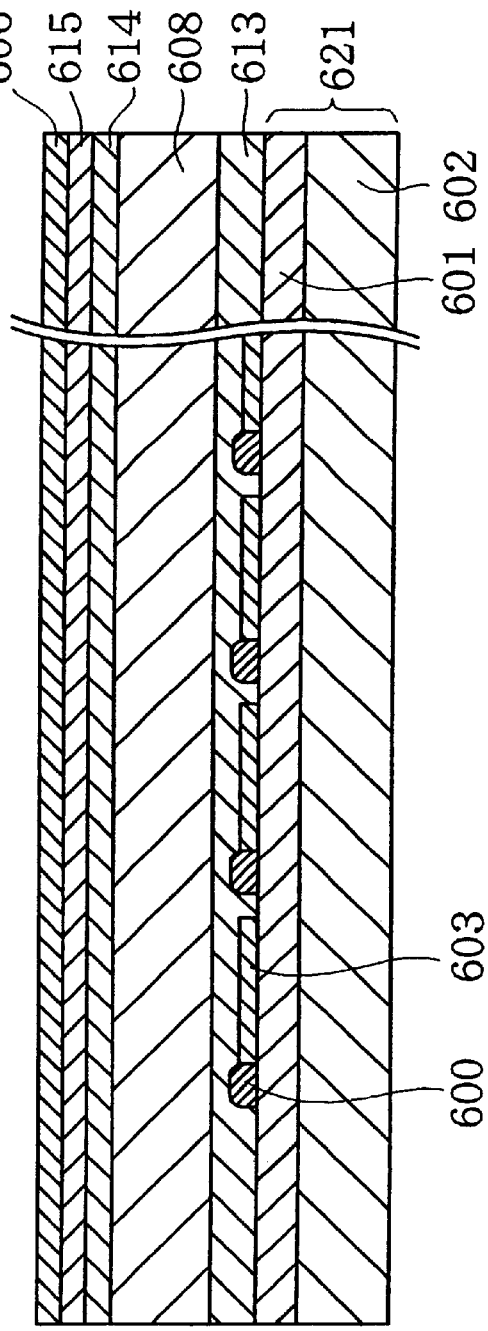

FIG. 6B shows an example of an organic EL display device in which TFTs made according to the present invention are used for the pixel TFTs. The organic EL display device includes the following: a TFT 600 according to the present invention; a source wring line electrically connected to the source electrode of the TFT 600; a drain line electrically connected to the drain electrode of the TFT 600; a gate line electrically connected to the gate electrode of the TFT 600; a pixel electrodes (a display electrode) 603 formed on a surface of the insulating substrate 621; a transparent common electrode (an opposing electrode) 606; and a layered light emitting unit sandwiched by the pixel electrodes 603 and the transparent common electrode 606. The layered light emitting unit has an electron injecting layer 613, an organic light emitting layer 608, a hole transport layer 614, and a buffer layer 615, which are layered in this order from the pixel electrode side. Note that in FIGS. 6A and 6B, those wiring lines are not shown for the sake of brevity and clarity in the drawings.

Although the present invention has been fully described by way of examples with reference to the accompanying drawings, it is to be noted that various changes and modifications will be apparent to those skilled in the art. Therefore, unless such changes and modifications depart from the spirit and scope of the present invention defined by the appended claims, they should be construed as being included therein.

What is claimed is:

1. A thin film transistor formed on an insulating substrate, comprising:
   a channel region comprising a high melting point region composing a first semiconductor;
   a source region in contact with the high melting point region of the channel region, the source region comprising a first low melting point region comprising a second semiconductor having a melting point lower than that of the first semiconductor, and the source region containing a first dopant;
   a source electrode electrically connected to the high melting point region of the channel region via the first low melting point region of the source region;
   a drain region being spaced apart from the source region and in contact with the high melting point region of the channel region, the drain region comprising a second low melting point region comprising a third semiconductor having a melting point lower than that of the first semiconductor, and the drain region containing a second dopant;
   a drain electrode electrically connected to the high melting point region of the channel region via the low melting point region of the drain region; and
   a gate electrode electrically insulated from the channel region, the source electrode, and the drain electrode, the gate electrode controlling an electric field applied to the channel region.

2. A thin film transistor according to claim 1, wherein the first semiconductor of the channel region is a polycrystalline semiconductor.

3. A thin film transistor according to claim 2, wherein:
   the second semiconductor of the source region comprises a same semiconductor material as that of the first semiconductor of the channel region and has a crystal structure different from that of the first semiconductor; and
   the third semiconductor of the drain region comprises the same semiconductor material as that of the first semiconductor of the channel region and has a crystal structure different from that of the first semiconductor.

4. A thin film transistor according to claim 3, wherein the first semiconductor of the channel region is polycrystalline silicon and the second semiconductor of the source region and the third semiconductor of the drain region are amorphous silicon.

5. A thin film transistor according to claim 3, wherein:

the second low melting point region of the drain region has a low concentration-doped drain region and a high concentration-doped drain region, the low concentration-doped drain region being in contact with the channel region, and the high concentration-doped drain region having a dopant concentration higher than that of the low concentration-doped drain region and being connected to the channel region via the low concentration-doped drain region: and the drain electrode is in contact with the high concentration-doped drain region.

6. A thin film transistor according to claim 2, wherein each of the second semiconductor of the source region and the third semiconductor of the drain region comprises group IVB atoms and a same semiconductor material as that of the first semiconductor of the channel region.

7. A thin film transistor according to claim 6, wherein:

the second low melting point region of the drain region has a low concentration-doped drain region and a high concentration-doped drain region, the low concentration-doped drain region being in contact with the high melting point region of the channel region, and the high concentration-doped drain region having a dopant concentration higher than that of the low concentration-doped drain region and being connected to the channel region via the low concentration-doped drain region; and the drain electrode is in contact with the high concentration-doped drain region.

8. A thin film transistor according to claim 6, wherein the channel region comprises only the high melting point region, the high melting point region comprising polycrystalline silicon, the source region comprises only the first low melting point region, the first low melting point region comprising polycrystalline silicon germanium, and the drain region comprises the second low melting point region, the second low melting point region comprising polycrystalline silicon germanium.

9. A thin film transistor according to claim 8, wherein each of the low melting point regions of the source and drain regions has, in a local region thereof, a germanium high concentration region in which the atomic density of germanium is higher than that of the rest of the source or drain region; and the germanium high concentration region of the source region is in contact with the channel region and the source electrode and the germanium high concentration region of the drain region is in contact with the channel region and the drain electrode.

10. A thin film transistor according to claim 6, wherein the channel region comprises only the high melting point region, the source region has a polycrystalline silicon layer and a polycrystalline silicon germanium layer, the polycrystalline silicon germanium layer being the first low melting point region, and the drain region has a polycrystalline silicon layer and a polycrystalline silicon germanium layer, the polycrystalline silicon germanium layer being the second low melting point region.

11. A thin film transistor according to claim 2, wherein:

the second semiconductor of the source region comprises only a semiconductor material different from that of the first semiconductor; and the third semiconductor of the drain region comprises only a semiconductor material different from that of the first semiconductor.

12. A thin film transistor according to claim 11, wherein:

the second low melting point region of the drain region has a low concentration-doped drain region and a high concentration-doped drain region, the low concentration-doped drain region being in contact with the channel region, the high concentration-doped drain region having a dopant concentration higher than that of the low concentration-doped drain region and being connected to the channel region via the low concentration-doped drain region: and the drain electrode is in contact with the high concentration-doped drain region.

13. A thin film transistor according to claim 11, wherein the channel region comprises only the high melting point region, the high melting point region comprising polycrystalline silicon, the source region comprises only the first low melting point region, the first low melting point region comprising polycrystalline germanium, and the drain region comprises only the second low melting point region, the second low melting point region comprising polycrystalline germanium.

14. A thin film transistor according to claim 11, wherein the channel region comprises only the high melting point region, the source region has a polycrystalline silicon layer and a polycrystalline germanium layer, the polycrystalline germanium layer being the first low melting point region, and the drain region has a polycrystalline silicon layer and a polycrystalline germanium layer, the polycrystalline germanium layer being the second low melting point region.

15. A thin film transistor array substrate comprising:

an insulating substrate;

a plurality of thin film transistors arranged in a predetermined pattern, each of the thin film transistors comprising a) a channel region comprising a high melting point region composed of a first semiconductor, b) a source region being in contact with the high melting point region of the channel region, the source region comprising a first low melting point region composed of a second semiconductor having a melting point lower than that of the first semiconductor, and the source region containing a first dopant, c) a source electrode electrically connected to the high melting point region of the channel region via the first low melting point region of the source region, d) a drain region being spaced apart from the source region and in contact with the high melting point region of the channel region, the drain region comprising a second low melting point region composed of a third semiconductor having a melting point lower than that of the first semiconductor, and the drain region containing a second dopant, e) a drain electrode electrically connected to the high melting point region of the channel region via the low melting point region of the drain region, and f) a gate electrode electrically insulated from the channel region, the source electrode, and the drain electrode, the gate electrode controlling an electric field applied to the channel region;

a source line electrically connected to the source electrode;

a drain line electrically connected to the drain electrode; and a gate line electrically connected to the gate electrode.

16. A thin film transistor array substrate according to claim 15, wherein the channel region comprises only the high melting point region, the high melting point region comprising polycrystalline silicon, the source region comprises only the first low melting point region, the first low melting point region comprising polycrystalline silicon germanium, and the drain region comprises only the second low melting point region, the second low melting point region comprising polycrystalline silicon germanium.

17. A liquid crystal display device comprising:

an insulating substrate;

a thin film transistor formed on the insulating substrate, the thin film transistor comprising a) a channel region comprising a high melting point region composed of a first semiconductor, b) a source region being in contact with the high melting point region of the channel region, the source region comprising a first low melting point region composed of a second semiconductor having a melting point lower than that of the first semiconductor, and the source region containing a first dopant, c) a source electrode electrically connected to the high melting point region of the channel region via the first low melting point region of the source region, d) a drain region being spaced apart from the source region and in contact with the high melting point region of the channel region, the drain region comprising a second low melting point region composed of a third semiconductor having a melting point lower than that of the first semiconductor, and the drain region containing a second dopant, e) a drain electrode electrically connected to the high melting point region of the channel region via the low melting point region of the drain region, and f) a gate electrode electrically insulated from the channel region, the source electrode, and the drain electrode, the gate electrode controlling an electric field applied to the channel region;

a source line electrically connected to the source electrode;

a drain line electrically connected to the drain electrode;

a gate line electrically connected to the gate electrode;

a display electrode formed on a surface of the insulating substrate and electrically connected to the drain line;

a first liquid crystal alignment film covering the thin film transistors the source line, the drain line, the gate line, and the display electrode;

an opposing substrate opposing the insulating substrate;

an opposing electrode formed on the opposing substrate and opposing the display electrode;

a second liquid crystal alignment film formed on the opposing substrate and covering the opposing electrode;

a liquid crystal layer being in contact with the first liquid crystal alignment film and the second liquid crystal alignment film and sandwiched between the insulating substrate and the opposing substrate; and a sealing portion for sealing the liquid crystal layer, the sealing portion provided at a peripheral region of the insulating substrate and the opposing substrate.

18. A liquid crystal display device according to claim 17, wherein the channel region comprises only the high melting point region, the high melting point region comprising polycrystalline silicon, the source region comprises only the first low melting point region, the first low melting point region comprising polycrystalline silicon germanium, and the drain region comprises only the second low melting point region, the second low melting point region comprising polycrystalline silicon germanium.

19. An electroluminescent display device comprising:

an insulating substrate;

a thin film transistor formed on an insulating substrate, the thin film transistor comprising a) a channel region comprising a high melting point region composed of a first semiconductor, b) a source region being in contact with the high melting point region of the channel region, the source region comprising a first low melting point region composed of a second semiconductor having a melting point lower than that of the first semiconductor, and the source region containing a first dopant, c) a source electrode electrically connected to the high melting point region of the channel region via the first low melting point region of the source region, d) a drain region being spaced apart from the source region and in contact with the high melting point region of the channel region, the drain region comprising a second low melting point region composed of a third semiconductor having a melting point lower than that of the first semiconductor, and the drain region containing a second dopant, e) a drain electrode electrically connected to the high melting point region of the channel region via the low melting point region of the drain region, and f) a gate electrode electrically insulated from the channel region, the source electrode, and the drain electrode, the gate electrode controlling an electric field applied to the channel region;

a source line electrically connected to the source electrode;

a drain line electrically connected to the drain electrode;

a gate line electrically connected to the gate electrode;

a display electrode formed on a surface of the insulating substrate;

an opposing electrode opposing the display electrode; and a light-emitting layer formed between the display electrode and the opposing electrode.

20. An electroluminescent display device according to claim 19, wherein the light-emitting layer is an organic light-emitting layer comprising organic molecules.

21. An electroluminescent display device according to claim 20, wherein the channel region comprises only the high melting point region, the high melting point region comprising polycrystalline silicon, the source region comprises only the first low melting point region, the first low melting point region comprising polycrystalline silicon germanium, and the drain region comprises only the second low melting point region, the second low melting point region comprising polycrystalline silicon germanium.

* * * * *

UNITED STATES PATENT AND TRADEMARK OFFICE
CERTIFICATE OF CORRECTION

PATENT NO.    : 6,479,838 B2
DATED         : November 12, 2002
INVENTOR(S)   : Narihiro Morosawa It is certified that error appears in the above-identified patent and that said Letters Patent is hereby corrected as shown below:

Column 22,
Line 26, change "composing" to -- comprising --.

Signed and Sealed this

Twenty-seventh Day of May, 2003

JAMES E. ROGAN
*Director of the United States Patent and Trademark Office*